United States Patent
Fudge et al.

(10) Patent No.: US 7,289,049 B1
(45) Date of Patent: Oct. 30, 2007

(54) METHOD AND APPARATUS FOR COMPRESSED SENSING

(75) Inventors: Gerald Lothair Fudge, Rockwall, TX (US); Mark L. Wood, Garland, TX (US); Chen-Chu Alex Yeh, Fate, TX (US)

(73) Assignee: L3 Communications Integrated Systems L.P., Greenville, TX (US)

( * ) Notice: Subject to any disclaimer, the term of this patent is extended or adjusted under 35 U.S.C. 154(b) by 0 days.

(21) Appl. No.: 11/465,826

(22) Filed: Aug. 21, 2006

(51) Int. Cl.
*H03M 1/10* (2006.01)

(52) U.S. Cl. ........................... 341/123; 702/64

(58) Field of Classification Search ............... 341/122, 341/123, 155; 702/64–79
See application file for complete search history.

(56) References Cited

U.S. PATENT DOCUMENTS

| | | | |
|---|---|---|---|
| 6,473,013 B1 * | 10/2002 | Velazquez et al. | 341/155 |
| 6,567,567 B1 * | 5/2003 | Levin et al. | 382/284 |
| 6,819,279 B2 * | 11/2004 | Pupalaikis | 341/155 |
| 2005/0156775 A1 * | 7/2005 | Petre et al. | 341/155 |
| 2006/0029279 A1 | 2/2006 | Donoho | |
| 2006/0038705 A1 * | 2/2006 | Brady et al. | 341/13 |
| 2006/0200035 A1 * | 9/2006 | Ricci et al. | 600/513 |
| 2007/0027656 A1 * | 2/2007 | Baraniuk et al. | 702/189 |

OTHER PUBLICATIONS

Haupt, Jarvis et al.; Compressive Sampling for Signal Classification; Fortieth Asilomar Conference on☐☐Signals, Systems and Computers, 2006. ACSSC '06. Oct.-Nov. 2006 pp. 1430-1434.*

Friedlander, Benjamin; Random Projections for Sparse Channel Estimation and Equalization Signals; Fortieth Asilomar Conference on Systems and Computers, 2006. ACSSC '06. Oct.-Nov. 2006 pp. 453-457.*

Kirolos, S. et al.; Practical Issues in Implementing Analog-to-Information Converters; The 6th International Workshop on System-on-Chip for Real-Time Applications, IEEE, Dec. 2006 pp. 141-146.*

Robust Uncertainty Principles: Exact Signal Reconstruction from Highly Incomplete Frequency Information by: Emmanuel Candes, Justin Romberg & Terence Tao; Jun. 2004, Rev: Aug. 2005; Los Angeles, CA.

Joint Sparsity Models for Distributed Compressed Sensing, by: Marco F. Duarte, Shriram Sarvotham, Michael B. Wakin, Dror Baron, & Richard G. Baraniuk; Rice University 2005.

Practical Signal Recovery from Random Projections, by: Emmanuel Candes & Justin Romberg; draft: Jan. 25, 2005.

(Continued)

*Primary Examiner*—Howard L. Williams
(74) *Attorney, Agent, or Firm*—Hovey Williams, LLP

(57) ABSTRACT

Embodiments of the present invention provide a method and apparatus for compressed sensing. The method generally comprises forming a first compressed sensing matrix utilizing a first set of time indices corresponding to a first sampling rate, forming a second compressed sensing matrix utilizing a plurality of frequencies and a second set of time indices corresponding to a second sampling rate, forming a combined compressed sensing matrix from the first compressed sensing matrix and the second compressed sensing matrix, and reconstructing at least a portion of the input signal utilizing the combined compressed sensing matrix. The first and second sampling rates are each less than the Nyquist sampling rate for the input signal.

37 Claims, 4 Drawing Sheets

OTHER PUBLICATIONS

Random Filters for Compressive Sampling and Reconstruction, by: Joel a. Tropp, Michael B. Wakin, Marco F. Duarte, Dror Baron & Richard G. Baraniuk; ICASSP, May 2006.

Signal Reconstruction from Noisy Random Projections, by: Jarvis Haupt & Robert Nowak; Dept of Electrical & Computer Engineering, University of Wisconsin-Madison, Mar. 2005.

Signal Recovery from Partial Information via Orthogonal Matching Pursuit, by: Joel A. Tropp & Anna C. Gilbert; University of Michigan; Apr. 2005.

Stable Signal Recovery from Incomplete and Inaccurate Measurements; Emmanuel Candes, Justin Romberg, and Terence Tao; Applied & Computational Mathematics, Caltech, Pasadena, CA; Feb. 2005, Revised Jun. 2005.

Near Optimal Signal Recovery from Random Projections: Universal Encoding Strategies; Emmanuel Candes & Terence Tao; Applied & Computational Mathematics, Caltech, Pasadena, CA; Oct. 2004.

Compressed Sensing; David Donoho, IEEE Transactions on Information Theory, vol. 52, No. 4, Apr. 2006.

Sparse Signal Detection from Incoherent Projections; Marco Duarte, Mark Davenport, Michael Wakin & Richard Baraniuk; Rice University; ICASSP, May 2006.

Distributed Compressed Sensing of Jointly Sparse Signals; Marco Duarte, Shriram Sarvotham, Dror Baron, Michael Wakin & Richard Baraniuk; Rice University; 2005.

Fast Reconsruction in Compressed Sensing; Marco Duarte; Rice University; Spring 2005.

Near-Optimal Sparse Fourier Representations via Sampling; A. Gilbert, S. Guha, P. Indyk, S. Muthukrishnan & M. Strauss; Montreal, Quebec, Canada, May 2002.

Applications of Sparse Approximation in Communications; A. Gilbert; J. Tropp; University of Michigan, 2005.

Minimum Rate Sampling & Reconstruction of Signals with Arbitrary Frequency Support; Cormac Herley, Ping Wah Wong; IEEE Transactions on Information theory, vol. 45, No. 5, Jul. 1999.

Ambiguities in the Harmonic Retrieval Problem using Non-Uniform Sampling; V. Lefkaditis & A. Manikas; IEEE Proceedings online No. 20010619; 2001.

Use of the Symmetrical Number System in Resolving Single-Frequency Undersampling Aliases; Phillip Pace, Richard Leino & David Styer; IEEE 1997.

Reduction of Aliasing Ambiguities Through Phase Relations; R. Sanderson, J Tsui & N. Freese; IEEE Transactions on Aerospace & Electronic Systems, vol. 28, No. 4, Oct. 1992.

A Non-Uniform Sampling Technique for A/D Conversion; N. Sayiner, H, Sorensen & T. Viswanathan; IEEE 1993.

Two-Channel RSNS Dynamic Range; D. Styer & P. Pace; IEEE 2002.

Simultaneous Sparse Approximation via Greedy Pursuit; J. Tropp, A. Gilbert & M. Strauss; IEEE 2005.

Extensions of Compressed Sensing; Yaakov Tsaig; David Donoho; Oct. 22, 2004.

An Efficient Frequency-Determination Algorithm from Multiple Undersampled Waveforms; Xiang-Gen Xia; IEEE 2000.

Sampling Signals with Finite Rate of Innovation, by: Martin Vetterli, Pina Marziliano & Thierry Blu; IEEE Transactions on Signal Processing, vol. 50, No. 6, Jun. 2002.

* cited by examiner

```
% program    getSampleMatrixFWTx.m
% purpose    Generate random time / frequency sample matrix
% (1) Corresponds to Mx parallel randomly placed narrow-band (NB) filters
%  all coming together with a single full bandwidth output, then being sampled randomly in
%  time on a uniform clock grid at an average decimation of Nx/Mx by single ADC.
% (2) Can also sample the NB filters uniformly at Nquist (Nyquist for the data that is already
%  decimated in frequency by Nx/Mx), then add to a randomly sampled wideband path with
%  same total number of clock cycles in batch, then processed -- results are fairly similar.  Use
%  uniformIxT to sample the filter bank output in the time domain instead of randIxT.
% (3) Can also add then sample in time at uniform decimated rate instead of at average
%  random decimated rate as in (1) above; use the uniformIxT instead of randIxT
% different possibilities include:
% (a) random time selection of FD data, same time-selection for TD data
% (b) uniform selection of FD data, random time-selection for TD data
% (c) independent random time-selection of FD and TD data.

function [A,F,V,nrow] = getSampleMatrixFWTx(Mx, Nx)

decRatio = ceil(Nx/Mx);          % Nx/Mx preferably an integer to use the uniform grid
uniformIxT = [1:decRatio:Nx]';   % uniform grid (can be used; switch comments)
x = fft(eye(Nx));                % make DFT kernel matrix
Mxf = Mx;
randIxF = SigIndicies(Mxf, Nx);  % random frequency filter indices
%randIxF = uniformIxT;            % use uniform filterbank selection instead
V1 = x(randIxF,:);
V = [real(V1);imag(V1)];
V = V / norm(V(:,1));

F = pinv(V) * V;                 % F*x = time domain with random selected freqs
                                 % on uniform Nyquist clock grid (preferably don't
                                 % actually sample all of these however)

randIxT1 = SigIndicies(Mx, Nx);  % random time selection indices
randIxT2 = SigIndicies(Mx, Nx);  % random time selection indices % randIxT1 = uniformIxT;
% randIxT2 = randIxT1;

V2 = zeros(Mx, Nx);
A = F(randIxT1,:);
for (kx = 1:Mx)
V2(kx,randIxT2(kx)) = 1;
end
A = A+V2;                        % equivalent to parallel
```

FIG. 5

METHOD AND APPARATUS FOR COMPRESSED SENSING

BACKGROUND OF THE INVENTION

1. Field of the Invention

The present invention relates to reconstruction of sampled signals. More particularly, the invention relates to a method and apparatus for compressed sensing that utilizes a combined compressed sensing matrix to at least partially reconstruct an input signal.

2. Description of the Related Art

Sampling is a method of converting an analog signal into a numeric sequence. Analog signals are often sampled at spaced time intervals to form digital representations for storage, analysis, processing, or other uses. Typically an analog signal must be sampled at or above its Nyquist rate, which may be defined as twice the bandwidth of the analog signal or twice the highest frequency component of the analog signal in the case of baseband sampling. For wide bandwidth signals, sampling at the Nyquist rate requires a great amount of computing resources, processing power, and data storage. Furthermore, if the sampled data is to be transmitted to a secondary location, a large amount of bandwidth is required as well.

It is known, however, that if the signal to be sampled is sparse or compressible, i.e. there is a relatively small amount of data contained within limited components of the signal (expressed in time domain, frequency domain, and/or other transform domain), then sampling at the Nyquist rate is an inefficient use of resources. In the case of sparse or compressible signals, a recently developed method of sampling known as compressed sensing provides a theoretical basis for sampling at less than the Nyquist rate with either no or minimal information loss so that the compressed samples may be reconstructed as an accurate full-bandwidth representation or estimate of the original signals.

Unfortunately, known compressed sensing methods suffer from several limitations. For example, most physically realizable compressed sensing methods rely either on narrowband frequency sampling or random time sampling. Sampling only with narrowband frequency filters results in poor performance for signals with sparse representation in the frequency domain and sampling only with random time sampling results in poor performance for signals with a sparse representation in the time domain. Further, known compressed sensing methods have not been reduced to practice for effective physical implementation.

SUMMARY OF THE INVENTION

The present invention solves the above-described problems and provides a distinct advance in the art of signal sampling and reconstruction. More particularly, the invention provides a method and apparatus for compressed sensing that utilizes a combination of non-uniform sampling in time along with sampling of narrowband frequency filters, in conjunction with a combined compressed sensing matrix to reconstruct an input signal. Utilization of a combined compressed sensing matrix enables an input signal to be sampled at less than the Nyquist rate and at least partially reconstructed.

In one embodiment, the present invention provides a method of reconstructing an input signal. The method generally comprises forming a first compressed sensing matrix utilizing a first set of time indices corresponding to a first sampling rate, forming a second compressed sensing matrix utilizing a plurality of frequencies and a second set of time indices corresponding to a second sampling rate, forming a combined compressed sensing matrix from the first compressed sensing matrix and the second compressed sensing matrix, and reconstructing at least a portion of the input signal utilizing the combined compressed sensing matrix. The first and second sampling rates are each less than the Nyquist sampling rate for the input signal.

In another embodiment, the present invention provides an apparatus for reconstructing an input signal. The apparatus generally includes a memory and a processor coupled therewith. The memory is operable to store data corresponding to a plurality of frequencies, a first set of time indices corresponding to a first sampling rate, and a second set of time indices corresponding to a second sampling rate. The first and second sampling rates are each less than the Nyquist sampling rate for the input signal. The processor is operable to form a first compressed sensing matrix utilizing data corresponding to the first set of time indices, form a second compressed sensing matrix utilizing data corresponding to the plurality of frequencies and the second set of time indices, form a combined compressed sensing matrix from the first compressed sensing matrix and the second compressed sensing matrix, and reconstruct at least a portion of the input signal utilizing the combined compressed sensing matrix.

In another embodiment, the present invention provides an apparatus for reconstructing an input signal. The apparatus generally includes a receiving element, a wideband filter coupled with the receiving element, a plurality of narrowband filters coupled with the receiving element, a sampling element coupled with the wideband filter and the narrowband filters, and a processor coupled with the sampling element. The sampling element is operable to sample the output of the wideband filter at a first sampling rate and sample the output of the narrowband filters at a second sampling rate. The first and second sampling rates are each less than the Nyquist sampling rate for the input signal. The processor is operable to form a first compressed sensing matrix utilizing a first set of time indices corresponding to the first sampling rate, form a second compressed sensing matrix utilizing a plurality of frequencies corresponding to the narrowband filters and a second set of time indices corresponding to the second sampling rate, form a combined compressed sensing matrix from the first compressed sensing matrix and the second compressed sensing matrix, and reconstruct at least a portion of the input signal utilizing the combined compressed sensing matrix.

In another embodiment, the present invention provides an apparatus for sampling an input signal. The apparatus generally includes a receiving element, a wideband filter coupled with the receiving element, a plurality of narrowband filters coupled with the receiving element, a sampling element coupled with the wideband filter and the narrowband filters, and a processor coupled with the sampling element. The processor is operable to process sampled signals for compressed sensing, direct detection, or conventional purposes.

In another embodiment, the present invention provides a computer program for reconstructing an input signal. The computer program is stored on a computer-readable medium for operating a processor and generally includes a code segment operable to form a first compressed sensing matrix utilizing a first set of time indices corresponding to a first sampling rate, a code segment operable to form a second compressed sensing matrix utilizing a plurality of frequencies and a second set of time indices corresponding to a second sampling rate, a code segment operable to form a combined compressed sensing matrix from the first compressed sensing matrix and the second compressed sensing matrix, and a code segment operable to reconstruct at least a portion of the input signal utilizing the combined compressed sensing matrix. The first and second sampling rates are each less than the Nyquist sampling rate for the input signal.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein:

FIG. 5 is an exemplary listing of a computer program that is operable to perform at least portions of various embodiments of the present invention.

Figure 1:
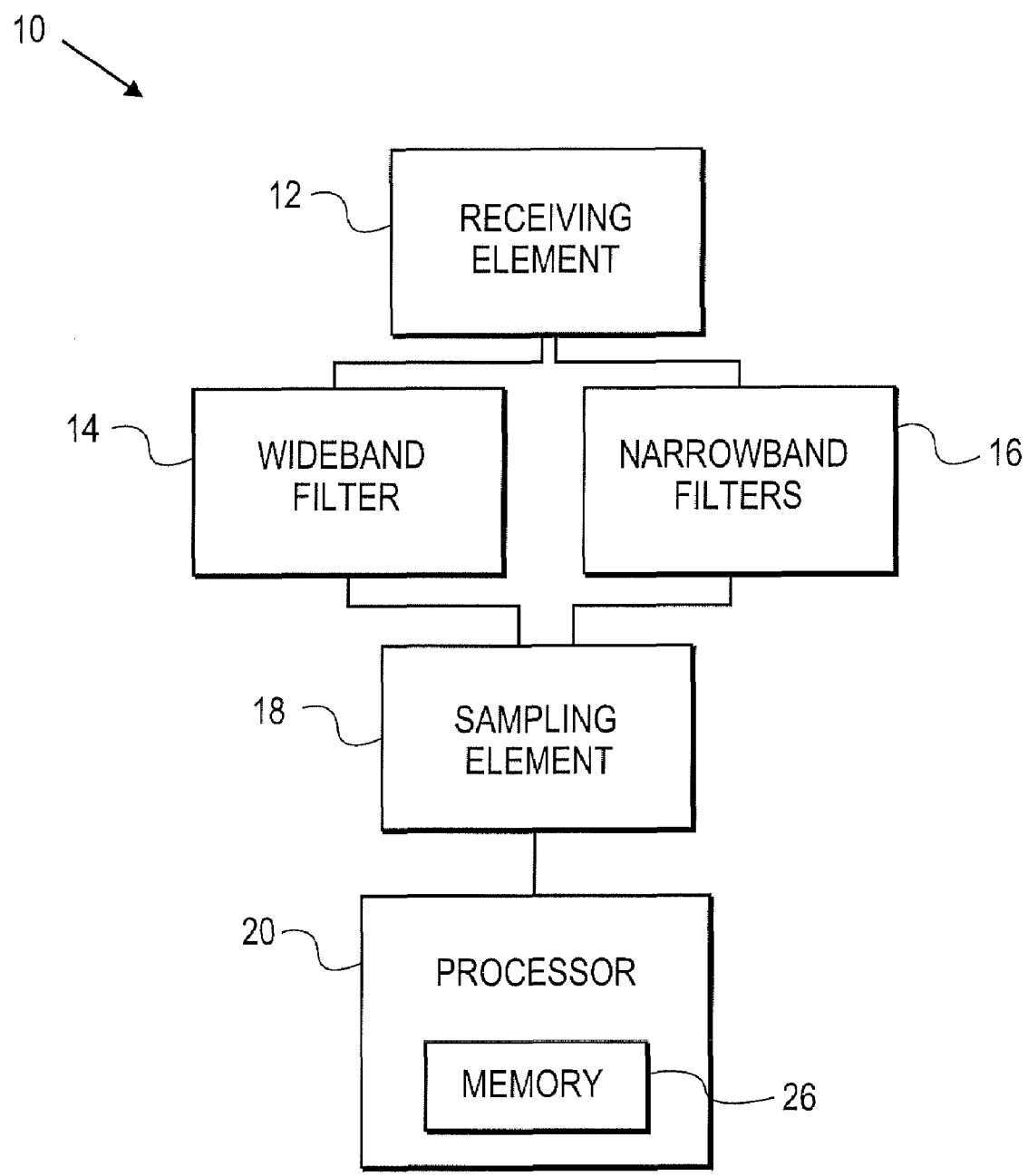
FIG. 1 is a block diagram showing some of the elements operable to be utilized by various embodiments of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 2:
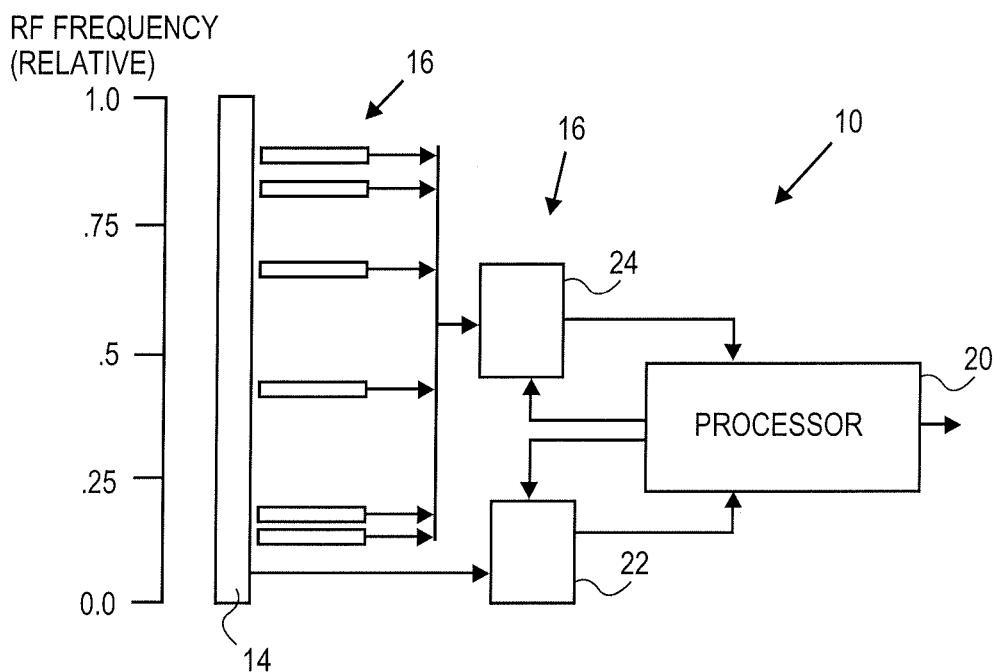
FIG. 2 is another block diagram illustrating a filtering combination employed by some of the elements of in FIG. 1.
Figure 3:
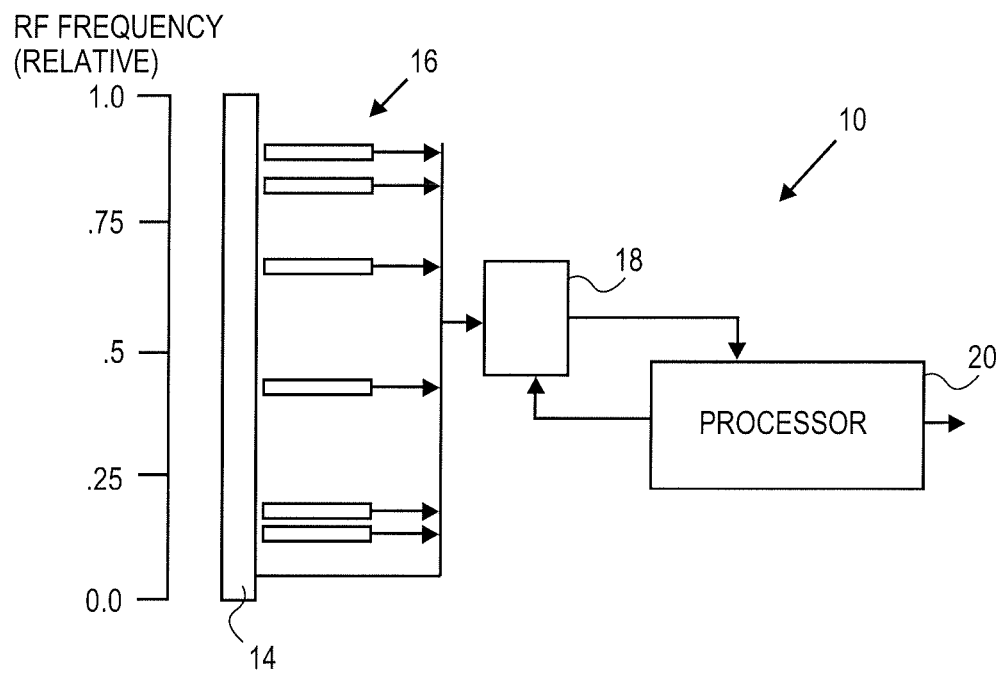
FIG. 3 is another block diagram illustrated an alternative filtering combination employed by some of the elements of FIG. 1.

Methods consistent with the present teachings are especially well-suited for implementation by an apparatus 10 as illustrated in FIGS. 1-3. The apparatus 10 generally includes a receiving element 12 operable to receive an input signal, a wideband filter 14 coupled with the receiving element and operable to filter the input signal, a plurality of narrowband filters 16 coupled with the receiving element 12, a sampling element 18 coupled with the filters 14, 16, and a processor 20 coupled with the sampling element 18 and operable to process signals.

The receiving element 12 may include any element or combination of elements operable to receive an input signal or a representation of the input signal. Preferably, the receiving element 12 is operable to receive an emitted electromagnetic signal or a representation thereof. Thus, the receiving element 12 may include any conventional antenna or electrical elements operable to acquire, detect, relay, store a signal, etc.

In various embodiments the receiving element 12 comprises a data connection, such as a wired or wireless network connection or element, to enable the apparatus 10 to receive data corresponding to the input signal through a network and/or from another electronic device. Thus, the receiving element 12 need not directly receive or detect the input signal.

The wideband filter 14 is coupled with the receiving element 12 and is operable to filter the input signal to a first range of frequencies and provide a wideband output signal corresponding to the filtered input signal. Consequently, the wideband filter 14 may be any device, element, or combination thereof that is operable to filter a signal to the first range of frequencies. The first range of frequencies is preferably sufficiently wide to allow passage of any relevant data and frequencies within the input signal. Thus, the first range of frequencies should preferably include the highest possible relevant frequency component of the input signal.

As should be appreciated, the wideband filter 14 may comprise one or more filter elements, and need not necessarily comprise a single discrete component. For instance, the wideband filter 14 may comprise a plurality of integrated circuits or discrete analog devices retained in separate housings or packages.

The first range of frequencies may be dynamically provided by the processor 20 or other apparatus 10 elements, and need not necessarily be a static value. For instance, the bandwidth of the wideband filter 14 may itself determine the appropriate first range of frequencies, the wideband filter may couple with the processor 20 to determine the first range of frequencies, or the first range of frequencies be manually provided by a user.

The plurality of narrowband filters 16 are coupled with the receiving element 12 to receive the input signal. Each narrowband filter 16 is operable to filter the input signal to a second range of frequencies with each second range of frequencies being less than the first range of frequencies. The range of frequencies included within each second frequency range is preferably different than the range of frequencies included within other second frequency ranges. However, the width of each second frequency range may be the same or different than the width of other second frequency ranges and the second range of frequencies provided by any one of the narrowband filters 16 may overlap with the second range of frequencies provided by any of the other narrowband filters 16. As discussed below in more detail, the combined frequency range provided by the sum of the each of the plurality of narrowband filters 16 may be less than the first range of frequencies.

The number of narrowband filters 16 provided by the apparatus 10 and the range of frequencies utilized by each provided narrowband filter 16 will largely depend on the desired utilization of the apparatus 10, including the number of samples required at Nyquist rate sampling, the total bandwidth of the input signal, the duration of signal sampling, etc. Thus, as should be appreciated by those skilled in the art, any number of narrowband filters 16 may be utilized by the present invention.

Each narrowband filter 16 may be any device, element, or combination thereof that is operable to filter the wideband output signal to the appropriate second range of frequencies. The plurality of narrowband filters 16 may be integral, such as by being comprised of the same integrated circuit or within the same housing or package, or be separate and discrete elements.

Preferably, the output of each narrowband filter 16 is summed with the output of at least one of the other narrowband filters 16 to provide a narrowband output signal. Thus, for instance, if six narrowband filters are utilized by the apparatus 10, the output of each of the six narrowband filters may be summed to provide the narrowband output signal. The output of the narrowband filters 16 is summed utilizing conventional methods and elements.

In various embodiments, the narrowband filters 16 may be tunable and switchable to determine which narrowband filters 16 are utilized to provide the narrowband output signal. For instance, if six selectable narrowband filters are utilized by the apparatus 10, four of the narrowband filters may be selected such that the narrowband output signal is comprised of only outputs from the four selected narrowband filters.

The narrowband filters 16 may each be selectable and/or tunable by utilizing elements integral with each narrowband filter 16 or by utilizing elements discrete from the filters 16. For instance, each narrowband filter 16 may be selectively engaged, disengaged, and tuned by including internal switches or each narrowband filter 16 may be selected and/or tuned by utilizing discrete switches, relays, and other conventional switching elements conventionally coupled with the narrowband filters 16 to select the appropriate signals or frequencies for the narrowband output signal.

Further, the processor 20 may be utilized to select the narrowband filters 16 and/or elements coupled with the narrowband filters 16. For example, the processor 20 may provide one or more control signals to each narrowband filter 16, or to a switching element coupled with each narrowband filter 16, for selection of the narrowband filters 16 and appropriate arrangement of the narrowband output signal.

The sampling element 18 is preferably coupled with the wideband filter 14 and the narrowband filters 16 to receive the wideband output signal and the narrowband output signal. As should be appreciated, the sampling element 18 need not directly be coupled with the filters 14, 16 to receive the wideband output signal and the narrowband output signal. The sampling element 18 is operable to sample the wideband output signal and the narrowband output signal utilizing one or more sampling clock signals to provide one or more sampled signals.

The sampling element 18 preferably synchronously samples the output signals utilizing one or more sampling clock signals. When triggered by an oscillating signal, such as by the rising or falling edge of one or more sampling clock signals, the sampling element 18 samples, such as by latching, the wideband output signal and/or the narrowband input signal to provide one or more sampled signals. The sampling element 18 may comprise digital or analog components, such as conventional memory or capturing elements.

Preferably, the sampling element 18 includes at least one analog-to-digital converter (ADC) to sample the analog wideband output signal and/or analog narrowband output signal and provide a digital representation of the analog signal. In some embodiments, the sampling element 18 includes a first ADC 22 coupled with the wideband filter 14 to receive and sample the wideband output signal and a second ADC 24 coupled with at least one of the narrowband filters 16 to receive and sample the narrowband output signal.

Utilization of two ADCs enables each ADC 22, 24 to sample utilizing a different sampling clock signal, thereby enabling sampling of the wideband output signal and narrowband output signal at different times or at substantially the same time. However, in some embodiments of the present invention as shown in FIG. 3, the wideband output signal and the narrowband output signal are summed before sampling by the sampling element 18, as is discussed below in more detail. In such embodiments, a single ADC may be utilized by the apparatus 10 as the sampling element 18 to sample the combined narrowband and wideband signal utilizing only one sampling clock signal.

The processor 20 is coupled with at least the sampling element 18 and is operable to process the sampled signal or signals. The processor 20 may include conventional processing and signal processing elements, including computers, computing elements, computing devices, microprocessors, microcontrollers, digital and analog logic elements, application-specific integrated circuits (ASICs), field-programmable gate arrays (FPGAs) or other programmable logic devices, digital signal processors (DSPs), combinations thereof, etc.

Preferably, the processor 20 includes or is otherwise coupled with memory 26. The memory 26 is operable to store data corresponding to apparatus 10 configuration, the wideband output signal, the narrowband output signal, the sampled signal or signals, and processed signals. The memory 26 may comprise any computer or electrically readable medium, as is discussed in more detail below.

In various embodiments, the processor 20 or its functions can be programmed in a hardware description language (HDL), such as VHDL or Verilog, and implemented in hardware using electronic computer-aided design software tools. In some embodiments, the processor 20 can be implemented in a programmable device such as a DSP or an FPGA. Furthermore, in some embodiments, all elements of the present invention may be implemented in a semi-custom or fully-custom mixed-signal ASIC.

In various embodiments, the apparatus 10 may alternatively or additionally comprise a plurality of computing elements or a network of computing elements such that one or more portions of the invention may be implemented utilizing a first computing element and one or more other portions of the invention may be implemented utilizing a second computing element.

The present invention can be implemented in hardware, software, firmware, or combinations thereof. In some embodiments, however, the invention is implemented with a computer program. The computer program and equipment described herein are merely examples of a program and equipment that may be used to implement the present invention and may be replaced with other software and computer equipment without departing from the scope of the present teachings. It will also be appreciated that the principles of the present invention are useful independently of a particular implementation, and that one or more of the steps described herein may be implemented without the assistance of the apparatus 10.

Computer programs consistent with the present teachings can be stored in or on a computer-readable medium residing on or accessible by the apparatus 10, such as the memory 26, for instructing the processor 20 to implement the method of the present invention as described herein. The computer program may comprise an ordered listing of executable instructions, although some parallel architectures that allow for non-ordered listing of instructions are acceptable, for implementing logical functions in the processor 20 and other computing devices coupled with or included within the apparatus 10. The computer program can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions.

The instructions comprising the computer program of the present invention will hereinafter be referred to simply as "the program" or "the computer program." It will be understood by persons of ordinary skill in the art that the program may comprise a single list of executable instructions or two or more separate lists, and may be stored on a single computer-readable medium or multiple distinct media. Further, the instructions may also be implemented in a hardware description language for implementation in a programmable logic device, as discussed above.

In the context of this application, a "computer-readable medium", including the memory 26, can be any means that can contain, store, communicate, propagate or transport the program for use by or in connection with the instruction execution system, apparatus, or device. The computer-readable medium can be, for example, but not limited to, an electronic, magnetic, optical, electromagnetic, infrared, or semi-conductor system, apparatus, device, or propagation medium. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disc (CD) or a digital video disc (DVD). The computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 4:
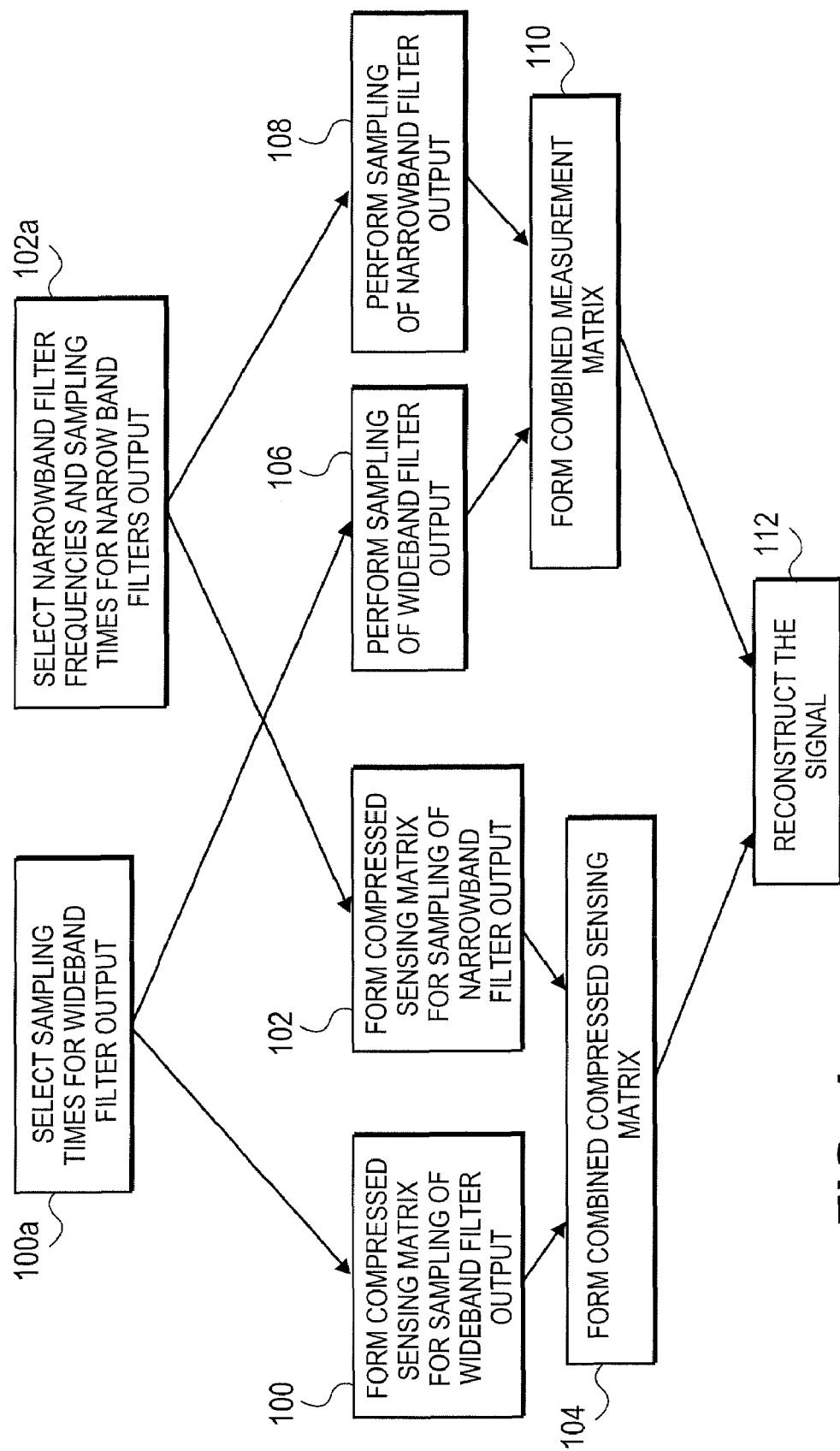
FIG. 4 is a flow chart showing some of the steps operable to be performed by the present invention.

A flowchart of steps that may be utilized by the present invention to perform compressed sensing is illustrated in FIG. 4. Some of the blocks of the flow chart may represent a module segment or portion of code of the computer program of the present invention which comprises one or more executable instructions for implementing the specified logical function or functions.

In step 100, a first compressed sensing matrix is formed. As should be appreciated by those skilled in the art, a compressed sensing matrix is a matrix utilized by compressed sensing methods to reconstruct a sparsely sampled input signal, as is discussed at length below. A compressed sensing matrix can also be used to resample and compress a Nyquist-sampled signal. The first compressed sensing matrix is generally formed utilizing a first set of time indices corresponding to a first sampling rate, where the first sampling rate is less than the Nyquist sampling rate for the input signal.

The first set of time indices is preferably embodied by K selected time indices, as shown at step 100a, represented by $\{T_{KT}\}$, from the set of N Nyquist time indices given by the Nyquist sampling rate. For example, if the Nyquist rate is 100 samples per unit of time, the set of N Nyquist time samples consists of 100 samples. If the first sampling rate is one-fifth of N (20 samples per unit of time), then $\{T_{KT}\}$ includes 20 time indices. Each of the K time indices in $\{T_{KT}\}$ may correspond to any one of the 100 indices in the Nyquist sample set. As should be appreciated, the first sampling rate may be embodied by the K time indices through direct identification of the K indices without actually computing the first sampling rate. Preferably, the first set of time indices thus corresponds to the first sampling rate and falls on a Nyquist rate or faster uniform grid of sample times.

The first compressed sensing matrix is a K×N matrix. K is preferably in the range of 4L to 6L with K being significantly less than N. L is the minimum number of coefficients required to capture the important information in the original signal. The actual values of K and N will vary depending upon the actual implementation of the present invention. However, a user, the apparatus 10, and/or the computer program may automatically estimate K and N based upon expected or desired signal reconstruction, signal characteristics, and system capabilities.

Preferably, the K time indices are selected based upon an arbitrary or random basis to facilitate accurate estimation and reconstruction of input signals. Consequently, the first sampling rate is not necessarily uniform. For instance, a user, the processor 20, and/or computer program may pseudo-randomly select K time indices from the set of N Nyquist time indices. However, the K time indices may be selected utilizing any criteria and are not necessarily randomly selected. Thus, the K time indices may be uniformly distributed throughout the set of N Nyquist indices.

As an illustrative example, an exemplary first compressed sensing matrix $\phi_T$ is shown below where K=4, N=8, and $\{T_{KT}\}=\{2, 4, 5, 8\}$:

$$\Phi_T = \begin{pmatrix} 0 & 1 & 0 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 0 & 0 & 1 \end{pmatrix}$$

If the exemplary first compressed sensing matrix $\phi_T$ is utilized to select samples from exemplary input x, the resulting relationship is:

$$\Phi_T x = \begin{pmatrix} x_2 \\ x_4 \\ x_5 \\ x_8 \end{pmatrix}$$

The formed first compressed sensing matrix may stored within the memory 26 for later use by the apparatus 10 as is discussed below in more detail. In some embodiments, a plurality of formed first compressed sensing matrix may be stored with the memory 26 to facilitate later use by the apparatus 10 and processor 20. For example, the processor 20 may form a plurality of first compressed sensing matrices corresponding to various or predictable combinations of K and N and store the formed first compressed sensing matrices as a database within the memory 26.

In step 102, a second compressed sensing matrix is formed utilizing a plurality of frequencies and a second set of time indices corresponding to a second sampling rate. The plurality of frequencies is selected at step 102a and corresponds to some portion of the entire frequency bandwidth of a signal. Preferably, the second compressed sensing matrix is formed by selecting rows from a Fourier transform matrix W generated utilizing a discrete time Fourier transform of an identity matrix I.

The identity matrix I is a N×N identity matrix wherein N corresponds to a desired number of discrete time Fourier transform (DTFT) points. As should be appreciated by those skilled in the art, the particular value of N will vary depending upon the particular implementation and configuration of the present invention. However, the apparatus 10 and/or the computer program may automatically estimate N based upon expected or desired reconstruction, signal characteristics, and system capabilities.

The Fourier transform matrix W is formed by taking a DTFT, fast Fourier transform (FFT), or other Fourier transform or combination of Fourier transforms of the N×N identity matrix I. The resulting Fourier transform matrix W is also a N×N matrix. An exemplary Fourier transform matrix W is shown below, where N=4, a significantly lower value than would preferably utilized in practice:

$$W = \begin{pmatrix} 1+0i & 1+0i & 1+0i & 1+0i \\ 1+0i & 0-1i & -1+0i & 0+1i \\ 1+0i & -1+0i & 1+0i & -1+0i \\ 1+0i & 0+1i & -1+0i & 0-1i \end{pmatrix}$$

The formed Fourier transform matrix W may be stored within the memory 26 for later use by the processor 20 or other elements. Further, the processor 20 and/or computer program may generate a plurality of Fourier transform matrices corresponding to different N values to facilitate rapid formation of the second compressed sensing matrix.

After formation or retrieval of the Fourier transform matrix W, one or more rows are selected from W to form an intermediate compressed sensing matrix represented by $\phi_F$. The rows are selected based upon a plurality of frequencies. Specifically, each row of the matrix W generally corresponds to one of the N Fourier transform points and selection of any row of W generally corresponds to selection of a particular frequency or plurality of frequencies. Thus, in some embodiments, the rows of W may be uniformly, pseudo-randomly, or arbitrarily selected to form the second compressed sensing matrix. The intermediate matrix $\phi_F$ may be specifically formed by appropriating the real and imaginary components of the selected rows of W (i.e. $\phi_F=[\text{Re}(W_{SEL});\text{Im}(W_{SEL})]$).

In preferred embodiments, the rows of W are selected and the intermediate compressed sensing matrix $\phi_F$ is formed according to the plurality of narrowband filters 16. For example, in some embodiments, each of the narrowband filters 16 corresponds to one of the N Fourier transform points and thus to one of the rows of matrix W. Selection of the narrowband filters 16 as discussed above determines which rows are W are selected to form $\phi_F$.

However, in some embodiments the narrowband filters 16 need not be selectable or selected to form the intermediate matrix $\phi_F$. For example, the apparatus 10 may employ a static (but preferably arbitrary or non-uniform) combination of non-selectable narrowband filters such that the narrowband output signal is always generated utilizing the same narrowband filters 16. In such embodiments, the same rows of W are always selected, and thus, the processor 10 may generate a plurality of intermediate matrices corresponding to different N values to enable rapid formation of the second compressed sensing matrix.

Preferably, the plurality of narrowband filters 16 comprise M narrowband filters, wherein M is substantially less than the N Fourier transform points. M is also preferably less than or equal to K. The total combined bandwidth of the M narrowband filters is preferably less than the total bandwidth of interest. The particular value of M will vary depending upon the particular implementation and configuration of the present invention. However, the apparatus 10 and/or the computer program may automatically estimate and select M based upon expected or desired reconstruction, signal characteristics, and system capabilities.

Additionally, in some embodiments as discussed above, the M narrowband filters may be static, such that the selected rows of matrix W and corresponding intermediate matrix $\phi_F$ are always the same for any N. However, in other embodiments, the M narrowband filters may be selectable and dynamically provided, such as where the plurality of narrowband filters 16 includes 1.5M or 2M narrowband filters, and the processor 20, computer program, and/or user arbitrary, randomly, or uniformly selects M filters from the 1.5M or 2M provided narrowband filters. Further, in some embodiments one or more of the narrowband filters 16 may be functionally combined to function as a single (one of M) narrowband filter.

Regardless of the number of narrowband filters 16 utilized by the present invention or the method employed to select rows from matrix W, the rows of W (and/or corresponding narrowband filters) are preferably selected based upon an arbitrary or random basis to facilitate accurate estimation and reconstruction of input signals, in a similar manner to the K time indices discussed above. For instance, the user, the processor 20, and/or computer program may pseudo-randomly select M rows from the matrix W.

Preferably, the intermediate matrix $\phi_F$ is further processed to form a second intermediate matrix $\phi_{NF}$, before formation of the second compressed sensing matrix. $\phi_{NF}$ is preferably normalized to have unity gain and is converted from the frequency domain to the time domain to form $\phi_{NF}$. Conversion of the intermediate matrix $\phi_F$ to the time domain enables the first and second compressed sensing matrices to be easily combined in step 104. $\phi_{NF}$ may be represented as:

$$\phi_{NF}=\phi_F\#\phi_F,$$

wherein # is the Moore-Penrose generalized inverse (pseudo-inverse) that may be derived from a singular value decomposition. $\phi_{NF}$ may also be computed by $$\phi_{NF}=(\phi_F)^T(\phi_F).$$

Before or after formation of the intermediate matrix $\phi_F$, a second set of K time indices, corresponding to the second sampling rate and represented by $\{T_{KF}\}$ is preferably generated from the set of N Nyquist time indices discussed above and shown in step 102a. Formation of $\{T_{KF}\}$ is substantially similar to the formation of $\{T_{KT}\}$ discussed in step 100, with an exception being that $\{T_{KF}\}$ generally represents the sampling times of the narrowband output signal while $\{T_{KT}\}$ generally represents sampling times of the wideband output signal.

In some embodiments, such as where it is desirable to sample the narrowband output signal and the wideband output signal at the same time, $\{T_{KF}\}$ may be the same as $\{T_{KT}\}$, thereby reducing the functional complexity of the present invention as shown in FIG. 3. In such embodiments, the first sampling rate and the second sampling rate are equal. However, as discussed above, $\{T_{KF}\}$ and $\{T_{KT}\}$ may each by randomly, arbitrarily, or uniformly formed.

The first sampling rate corresponds to formation of $\{T_{KT}\}$ and the first compressed sampling matrix and the second sampling rate corresponds to formation of $\{T_{KF}\}$ and the second compressed sensing matrix. As discussed above, the first sampling rate is also preferably the rate at which the wideband output signal is sampled at and the second sampling rate is also preferably the rate at which the narrowband output signal is sampled at. Further, as both sets of time indices may be randomly, arbitrarily, or uniformly formed, the corresponding first and second sampling rates may also be random, arbitrary, and/or uniform.

The sum of the first sampling rate and second sampling rate is preferably less than the Nyquist rate for the input signal. Preferably, the combined sampling rate representing the sum of the first and second sampling rates is significantly less than the Nyquist rate, such as half the Nyquist rate. In some embodiments, the combined sampling rate is preferably no more than one-fifth of the Nyquist rate. Of course, the extent to which the combined sampling rate is less than the Nyquist rate will depend on the nature of the input signal and how sparse or compressible the signal is, as well as other signals and noise that may be present.

The second compressed sensing matrix is then preferably formed utilizing both the second intermediate matrix $\phi_{NF}$ and $\{T_{KF}\}$. By selecting K rows from the M×N matrix $\phi_{NF}$ utilizing $\{T_{KF}\}$, a K×N matrix is formed as the second compressed sensing matrix. As should be appreciated by those skilled in the art, the second compressed sensing matrix may be formed by utilizing other equivalent methods.

In step 104, a combined compressed sensing matrix is formed. In preferred embodiments where both the first compressed sensing matrix and second compressed sensing matrix are in the time domain, the combined compressed sensing matrix may be formed by summing the first compressed sensing matrix and the second compressed sensing matrix. In other embodiments, the first compressed sensing matrix and the second compressed sensing matrix may first be converted into a common domain and then summed to form the combined compressed sensing matrix.

In step 106, a first measurement vector $y_T$ is formed by sampling the wideband output signal. Specifically, the first measurement vector $y_T$ is formed by sampling the wideband output signal at the first sampling rate discussed above in step 100. For example, the receiving element 12 may receive the input signal, the wideband filter 14 may filter the input signal to provide the wideband output signal, and the sampling element 18 may sample the wideband output signal at the first sampling rate, as defined by the K time indices $\{T_{KT}\}$. Thus, for each time listed in $\{T_{KT}\}$, the wideband output signal is sampled. Sampling of the wideband output signal according to the K time indices of $\{T_{KT}\}$ forms the first measurement vector $y_T$ as a K×1 vector. As the first sampling rate is substantially less than the Nyquist rate (K<<N), the present invention may easily sample high frequency signals.

In some embodiments, the first measurement vector $y_T$ may be formed by sampling the wideband output signal with the sampling element 18 at the Nyquist rate and then discarding samples based upon the first sampling rate and $\{T_{KT}\}$. For instance, if sampling at the Nyquist rate results in 100 samples and K=20, 80 of the 100 samples may be randomly, arbitrarily, or uniformly discarded to form the first measurement vector $y_T$.

In step 108, a second measurement vector $y_F$ is formed by sampling the narrowband output signal. Specifically, the second measurement vector $y_F$ is formed by sampling the narrowband output signal at the plurality of frequencies discussed in step 102. For example, the narrowband output signal formed by the M narrowband filters 16 is sampled by the sampling element 18 to form the second measurement vector $y_T$. In various embodiments, the narrowband output signal is sampled by the sampling element 18 according to the second sampling rate and $\{T_{KF}\}$. Sampling of the narrowband output signal according to the K time indices of $\{T_{KF}\}$ forms the second measurement vector $y_F$ as a K×1 vector. Preferably, both $\{T_{KF}\}$ and $\{T_{KT}\}$ include the same number of indices (K=K).

In embodiments where $\{T_{KT}\}=\{T_{KF}\}$, steps 106 and 108 may be performed as a single combined step. For example, as shown in FIG. 3, the narrowband output signal and the wideband output signal may be summed before sampling by the sampling element 18. Summation of the narrowband and wideband output signals reduces system complexity and sampling requirements and eliminates the need to form both the first and second measurement vectors.

In some embodiments, the sampling element 18 may sample the narrowband output signal at the Nyquist rate and then discard appropriate samples according to the second sampling rate and $\{T_{KF}\}$, in a similar manner to formation of the first measurement vector discussed above in step 106.

In step 110, a combined measurement vector y is formed by adding $y_F$ to $y_T$: $y=y_F+y_T$. The resulting combined measurement vector y is a K×1 vector. All will be discussed in more detail below, the relationship between the combined measurement vector y, the combined compressed sensing matrix $\phi$, and a reconstruction or estimation of the input signal x, is given by $y=\phi_{NFT}x+\phi_T x=\phi x$.

In some embodiments, such as those where $\{T_{KT}\}=\{T_{KF}\}$, the combined measurement vector y may equal $y_F$ or $y_T$ such that completion of both steps 106 and 108 is not required. For example, where the narrowband and wideband output signals are summed before sampling by the sampling element 18 as shown in FIG. 3, the combined measurement vector y is formed by sampling the summed combination of the narrowband and wideband output signals.

In step 112, the input signal is at least partially reconstructed utilizing the combined compressed sensing matrix. As utilized herein, "reconstructed" refers to any method of estimating, extrapolating, projecting, or reconstructing the input signal from the sampled input signal, such as by utilizing the measurement vector y or other representations of the sampled wideband and narrowband output signals, and the combined compressed sensing matrix.

Preferably, a matrix-based compressed sensing reconstruction approach is employed to provide a full-bandwidth representation of at least a portion of the input signal at the Nyquist sampling rate, without actually sampling at the Nyquist rate or storing all data corresponding to Nyquist rate sampling, by utilizing the combined compressed sensing matrix and the combined measurement vector. Various matrix-based approaches are known in the art and any one variation of these approaches may be employed by the present invention to reconstruct a signal utilizing the combined compressed sensing matrix and the combined measurement vector.

More preferably, the input signal is at least partially reconstructed by solving a minimization to get the best input signal representation x that is consistent with the measurement vector y and the combined compressed sensing matrix $\phi$. Input signal reconstruction functions most appropriately when the input signal is has a sparse representation in some basis $\psi$. For example, assume the input signal comprises a sparsely represented signal of interest and a non-sparsely represented noise signal. Through utilization of steps 100-112, the present invention is operable to accurately reconstruct a full bandwidth representation of the signal of interest at the Nyquist sampling rate without actually sampling at the Nyquist rate. The noise signal is not reconstructed due to its non-sparse representation. Thus, the present invention is most accurate when the input signal does not include relevant data at all frequencies and sampled times.

One preferred reconstruction method is to reconstruct the input signal as follows:

$$\min_{x}\|\Psi^T x\|_1 \text{ subject to } \|y - \Phi x\|_2 < \varepsilon$$

The optimization utilized with the above criteria generally corresponds to a linearly constrained convex quadratic program that may be solved using various available techniques such as basis pursuit or modified basis pursuit (basis pursuit de-noising). The basis pursuit or modified basis pursuit methods employed by the present invention may be generally similar to the basis pursuit methods disclosed by Y. Tsaig and D. L. Donoho in their Oct. 22, 2004, paper entitled "Extensions of Compressed Sensing", which is incorporated herein by reference.

Another preferred reconstruction method is orthogonal matching pursuit. Various orthogonal matching pursuit methods that may be employed by the present invention are disclosed by J. A. Tropp and A. C. Gilbert in their Apr. 11, 2005, paper entitled "Signal Recovery From Partial Information Via Orthogonal Matching Pursuit" which is incorporated herein by reference. While the l2 norm may be minimized instead of the l1 norm, the reconstruction is more accurate in general if the l1 norm is minimized.

As should be appreciated by those skilled in the art, different reconstruction methods or frame elements may be used by the present invention depending on the appropriate signal class, although it should be appreciated that some reconstruction methods will perform better than others given the dual nature of the time-frequency sampling.

Thus, by utilizing various reconstruction methods, the combined compressed sensing matrix, and the combined measurement vector, the present invention is operable to provide an accurate full-bandwidth representation of at least a portion of the input signal at the Nyquist sampling rate, without actually requiring sampling at the Nyquist rate, particularly when in the input signal is sparsely represented in some basis.

Another embodiment of the invention utilizes various hardware elements, including the receiving element 12, the wideband filter 14, the narrowband filters 16, the sampling element 18, the processor 20, and the memory 26, without performing reconstruction using the combined compressed sensing matrix. In this embodiment, the hard elements produce direct detection and measurement information and would reserve the processing power normally spent on reconstructing the signal with the combined compressed sensing matrix. Also in this embodiment, time sampling of the signal is not constrained to having to occur on the Nyquist-sampling time grid, and frequency sampling of the signal is not constrained to having to occur at the frequencies dictated by the DTFT frequency grid.

Although the invention has been described with reference to the preferred embodiment illustrated in the attached drawing figures, it is noted that equivalents may be employed and substitutions made herein without departing from the scope of the invention as recited in the claims. For example, the present invention may be employed for resampling a previously Nyquist sampled signal that is sparsely represented in some basis. Specifically, the combined compressed sensing matrix, represented by $\phi$, may be utilized to resample the previously Nyquist sampled signal, x, to reduce computing resources, bandwidth, or storage capacity consumed by the Nyquist sampled signal.

Having thus described the preferred embodiment of the invention, what is claimed as new and desired to be protected by Letters Patent includes the following:

The invention claimed is:

1. A method of reconstructing an input signal, the method comprising the steps of:
   (a) forming a first compressed sensing matrix utilizing a first set of time indices corresponding to a first sampling rate, the first sampling rate being less than the Nyquist sampling rate for the input signal;
   (b) forming a second compressed sensing matrix utilizing a plurality of frequencies and a second set of time indices corresponding to a second sampling rate, the second sampling rate being less than the Nyquist sampling rate for the input signal;
   (c) forming a combined compressed sensing matrix from the first compressed sensing matrix and the second compressed sensing matrix; and
   (d) reconstructing at least a portion of the input signal utilizing the combined compressed sensing matrix.

2. The method of claim 1, further comprising the steps of:
   (e) sampling the input signal at the first sampling rate to form a first measurement vector,
   (f) sampling the input signal at the frequencies and the second sampling rate to form a second measurement vector, and
   (g) forming a combined measurement vector utilizing the first measurement vector and the second measurement vector.

3. The method of claim 2, wherein step (d) includes reconstructing at least a portion of the input signal utilizing the combined compressed sensing matrix and the combined measurement vector.

4. The method of claim 1, wherein step (a) includes selecting sampling times for inclusion in the first set of time indices.

5. The method of claim 1, wherein the first sampling rate and the second sampling rate are substantially equal.

6. The method of claim 1, wherein the sum of the first sampling rate and the second sampling rate is less than the Nyquist sampling rate for the input signal.

7. The method of claim 1, wherein step (b) includes forming the second compressed sensing matrix utilizing the second set of time indices and a Fourier transform matrix generated utilizing a discrete time Fourier transform of an identity matrix.

8. The method of claim 1, wherein the plurality of frequencies correspond to a plurality of narrowband filters.

9. The method of claim 1, wherein step (d) includes reconstructing the input signal utilizing the combined compressed sensing matrix to form a full-bandwidth representation of at least a portion of the input signal at the Nyquist sampling rate.

10. An apparatus for reconstructing an input signal, the apparatus comprising:
    a memory operable to store data corresponding to a plurality of frequencies, a first set of time indices corresponding to a first sampling rate, a second set of time indices corresponding to a second sampling rate, the first and second sampling rates each being less than the Nyquist sampling rate for the input signal; and
a processor coupled with the memory to receive data therefrom, the processor operable to—
  form a first compressed sensing matrix utilizing data corresponding to the first set of time indices,
  form a second compressed sensing matrix utilizing data corresponding to the plurality of frequencies and the second set of time indices,
  form a combined compressed sensing matrix from the first compressed sensing matrix and the second compressed sensing matrix, and
  reconstruct at least a portion of the input signal utilizing the combined compressed sensing matrix.

11. The apparatus of claim 10, wherein the memory is further operable to store data corresponding to the input signal sampled at the plurality of frequencies, the first sampling rate, and the second sampling rate.

12. The apparatus of claim 11, wherein the processor is further operable to—
  generate a first measurement vector utilizing data corresponding to the input signal sampled at the first sampling rate,
  generate a second measurement vector utilizing data corresponding to the input signal sampled at the second sampling rate,
  form a combined measurement vector utilizing the first measurement vector and the second measurement vector, and
  reconstruct the input signal utilizing the combined compressed sensing matrix and the combined measurement vector.

13. The apparatus of claim 10, wherein the sum of the first sampling rate and the second sampling rate is less than the Nyquist sampling rate for the input signal.

14. The apparatus of claim 10, wherein the processor reconstructs the input signal utilizing the combined compressed sensing matrix to form a full-bandwidth representation of at least a portion of the input signal at the Nyquist sampling rate.

15. The apparatus of claim 10, wherein the memory is integral with the processor.

16. An apparatus for reconstructing an input signal, the apparatus comprising:
  a receiving element operable to receive the input signal;
  a wideband filter coupled with the receiving element to filter the input signal to a first range of frequencies and provide a wideband output signal corresponding to the filtered input signal;
  a plurality of narrowband filters coupled with the receiving element, each narrowband filter being operable to filter the input signal to a second range of frequencies, each second range of frequencies being less than the first range of frequencies, the plurality of narrowband filters operable to provide a narrowband output signal corresponding to the sum of the outputs of the narrowband filters;
  a sampling element coupled with the wideband filter and the narrowband filters to receive the wideband output signal and the narrowband output signal, the sampling element operable to sample the wideband output signal at a first sampling rate and sample the narrowband output signal at a second sampling rate to provide at least one sampled signal, the first and second sampling rates each being less than the Nyquist sampling rate for the input signal; and
  a processor coupled with the sampling element and operable to—
    form a first compressed sensing matrix utilizing a first set of time indices corresponding to the first sampling rate,
    form a second compressed sensing matrix utilizing a plurality of frequencies corresponding to the narrowband filters and a second set of time indices corresponding to the second sampling rate,
    form a combined compressed sensing matrix from the first compressed sensing matrix and the second compressed sensing matrix, and
    reconstruct at least a portion of the input signal utilizing the combined compressed sensing matrix.

17. The apparatus of claim 16, wherein first sampling rate and the second sampling rate are equal.

18. The apparatus of claim 16, wherein the sampling element comprises a first sampling element coupled with the wideband filter to receive and sample the wideband output signal at the first sampling rate and a second sampling element coupled with the narrowband filter to receive and sample the narrowband filter output signal at the second sampling rate.

19. The apparatus of claim 16, wherein the sum of the first sampling rate and the second sampling rate is less than the Nyquist sampling rate for the input signal.

20. The apparatus of claim 16, wherein the processor is further operable to—
  form a measurement vector utilizing the sampled signal, and
  reconstruct at least a portion of the input signal utilizing the combined compressed sensing matrix and the measurement vector.

21. The apparatus of claim 16, wherein the sampling element is operable to provide a sampled narrowband output signal and a sampled wideband output signal and the processor is further operable to—
  form a first measurement vector utilizing the sampled wideband output signal,
  form a second measurement vector utilizing the sampled narrowband output signal,
  form a combined measurement vector utilizing the first and second measurement vectors, and
  reconstruct the input signal utilizing the combined compressed sensing matrix and the combined measurement vector.

22. The apparatus of claim 16, wherein the processor is operable to form the second compressed sensing matrix utilizing the plurality of frequencies, the second set of time indices, and a Fourier transform matrix generated utilizing a discrete time Fourier transform of an identity matrix.

23. The apparatus of claim 16, wherein the processor reconstructs at least a portion of the input signal utilizing the combined compressed sensing matrix to form a full-bandwidth representation of the input signal at the Nyquist sampling rate.

24. The apparatus of claim 16, wherein the processor is further operable to select at least one of the narrowband filters to determine which narrowband filters are utilized to provide the narrowband output signal and form the second compressed sensing matrix.

25. An apparatus for sampling an input signal, comprising:
  a receiving element operable to receive the input signal;

a wideband filter coupled with the receiving element to filter the input signal to a first range of frequencies and provide a wideband output signal corresponding to the filtered input signal;

a plurality of narrowband filters coupled with the receiving element, each narrowband filter being operable to filter the input signal to a second range of frequencies, each second range of frequencies being less than the first range of frequencies, the plurality of narrowband filters operable to provide a narrowband output signal corresponding to the sum of the outputs of the narrowband filters;

a sampling element coupled with the wideband filter and the narrowband filters to receive the wideband output signal and the narrowband output signal, the sampling element operable to sample the wideband output signal at a first sampling rate and sample the narrowband output signal at a second sampling rate to provide at least one sampled signal; and a processor coupled with the sampling element and operable to process the sampled signal.

26. The apparatus of claim 25, wherein the first and second sampling rates are each less than the Nyquist sampling rate for the input signal and the processor is further operable to— form a first compressed sensing matrix utilizing a first set of time indices corresponding to the first sampling rate, form a second compressed sensing matrix utilizing a plurality of frequencies corresponding to the narrowband filters and a second set of time indices corresponding to the second sampling rate, form a combined compressed sensing matrix from the first compressed sensing matrix and the second compressed sensing matrix, and reconstruct at least a portion of the input signal utilizing the combined compressed sensing matrix.

27. The apparatus of claim 26, wherein the first and second sampling rates are equal.

28. The apparatus of claim 26, wherein the sum of the first sampling rate and the second sampling rate is less than the Nyquist sampling rate for the input signal.

29. The apparatus of claim 25, wherein the processor is operable to perform direct detection on the sampled signal.

30. A computer program for reconstructing an input signal, the computer program stored on a computer-readable medium for operating a processor and comprising:

a code segment operable to form a first compressed sensing matrix utilizing a first set of time indices corresponding to a first sampling rate, the first sampling rate being less than the Nyquist sampling rate for the input signal;

a code segment operable to form a second compressed sensing matrix utilizing a plurality of frequencies and a second set of time indices corresponding to a second sampling rate, the second sampling rate being less than the Nyquist sampling rate for the input signal;

a code segment operable to form a combined compressed sensing matrix from the first compressed sensing matrix and the second compressed sensing matrix; and a code segment operable to reconstruct at least a portion of the input signal utilizing the combined compressed sensing matrix.

31. The computer program of claim 30, further comprising— a code segment operable to acquire data corresponding to sampling of the input signal at the first sampling rate and form a first measurement vector utilizing the data acquired at the first sampling rate, a code segment operable to acquire data corresponding to sampling of the input signal at the second sampling rate and form a second measurement vector utilizing the data acquired at the second sampling rate, and a code segment operable to form a combined measurement vector utilizing the first measurement vector and the second measurement vector.

32. The computer program of claim 31, wherein at least a portion of the input signal is reconstructed utilizing the combined compressed sensing matrix and the combined measurement vector.

33. The computer program of claim 30, wherein the sum of the first sampling rate and the second sampling rate is less than the Nyquist sampling rate for the input signal.

34. The computer program of claim 30, wherein the first sampling rate and the second sampling rate are equal.

35. The computer program of claim 30, wherein the second compressed sensing matrix is formed utilizing the plurality of frequencies, the second set of time indices, and a Fourier transform matrix generated utilizing a discrete time Fourier transform of an identity matrix.

36. The computer program of claim 30, wherein at least a portion of the input signal is reconstructed utilizing the combined compressed sensing matrix to form a full-bandwidth representation of the signal at the Nyquist sampling rate.

37. The computer program of claim 30, wherein the plurality of frequencies correspond to a plurality of narrowband filters.

* * * * *